US006248018B1

(12) United States Patent
Kehlstadt et al.

(10) Patent No.: US 6,248,018 B1
(45) Date of Patent: *Jun. 19, 2001

(54) ELECTROMAGNETIC POINTING DEVICE USING VARYING OVERLAP OF COILS AND CONDUCTIVE ELEMENTS

(75) Inventors: Florian Kehlstadt, Aclens; Antoine Merminod, Treytorrens; Marc Bidiville, Pully; René Sommer, Renens; Dénes Karaï, Cheserex, all of (CH)

(73) Assignee: Logitech, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/153,567

(22) Filed: Sep. 15, 1998

Related U.S. Application Data

(63) Continuation-in-part of application No. 08/956,840, filed on Oct. 23, 1997, now Pat. No. 5,911,627.
(51) Int. Cl.[7] ........................................... A63F 9/22
(52) U.S. Cl. .................. 463/38; 463/36; 463/37; 275/148 B; 345/161
(58) Field of Search ................... 273/148 B; 463/36–38; 345/161

(56) References Cited

U.S. PATENT DOCUMENTS

| 4,161,726 | 7/1979 | Burson et al. | 340/365 |
| 4,255,626 | 3/1981 | Watts et al. | 200/6 |
| 4,305,007 | 12/1981 | Hughes | 307/116 |
| 4,369,397 | 1/1983 | Read | 318/54 |

(List continued on next page.)

FOREIGN PATENT DOCUMENTS

| 0 126 223A2 | 2/1984 | (EP) | G01D/5/32 |
| 0 466 298A1 | 4/1991 | (EP) | G01D/5/34 |
| 1 472 066 | 6/1974 | (GB) | G01S/5/16 |
| 9006527 | 1/1997 | (JP) | G06F/3/033 |

*Primary Examiner*—Valencia Martin-Wallace
*Assistant Examiner*—Carmen D. White
(74) *Attorney, Agent, or Firm*—Townsend and Townsend and Crew LLP

(57) ABSTRACT

A micro-stick in which the movement of the micro-stick is detected inductively. The micro-stick is connected to an actuator element which varies interaction between an electromagnetic element and a number of conductive coils. In one embodiment, the coils are mounted on a printed circuit board mounted beneath the micro-stick. The micro-stick is mounted on a plate having a number of pins extending through the circuit board. On the other side of the circuit board is a flexible metal sheet which is contacted by the pins, and moved away from the coils in a direction in which the micro-stick is tilted. This increased separation of the metal sheet from the coils can then be detected.

12 Claims, 9 Drawing Sheets

U.S. PATENT DOCUMENTS

| | | | |
|---|---|---|---|
| 4,439,648 | 3/1984 | Reiner et al. | 200/6 |
| 4,459,022 | 7/1984 | Morey | 356/152 |
| 4,459,578 | 7/1984 | Sava et al. | 338/128 |
| 4,489,303 | 12/1984 | Martin | 338/128 |
| 4,533,827 | 8/1985 | Fincher | 250/211 |
| 4,607,159 | 8/1986 | Goodson et al. | 250/221 |
| 4,642,595 | 2/1987 | Ruumpol et al. | 336/135 |
| 4,654,576 | 3/1987 | Oelsch et al. | 322/3 |
| 4,685,678 | 8/1987 | Frederiksen | 273/148 |
| 4,731,530 | 3/1988 | Mikan | 250/231 |
| 4,825,157 | 4/1989 | Mikan | 324/208 |
| 4,855,704 | 8/1989 | Betz | 336/132 |
| 4,856,785 | 8/1989 | Lantz et al. | 273/148 |
| 4,879,556 | 11/1989 | Duimel | 341/20 |
| 4,994,669 | 2/1991 | Stern | 250/229 |
| 5,043,709 | 8/1991 | Kim | 340/709 |
| 5,117,102 | 5/1992 | Mitchell | 250/229 |
| 5,128,671 | 7/1992 | Thomas, Jr. | 341/20 |
| 5,160,918 | 11/1992 | Saposnik et al. | 340/709 |
| 5,164,722 | 11/1992 | Laroze et al. | 341/20 |
| 5,181,079 | 1/1993 | Klinger | 356/375 |
| 5,409,074 | 4/1995 | Wilson et al. | 180/6.5 |
| 5,621,207 | 4/1997 | O'Mara | 250/221 |
| 5,687,080 | 11/1997 | Hoyt et al. | 364/190 |
| 5,694,123 * | 12/1997 | Selker et al. | 341/22 |
| 5,771,038 * | 6/1998 | Wang | 345/163 |
| 5,911,627 * | 6/1999 | Piot et al. | 463/38 |
| 5,929,844 * | 7/1999 | Barnes | 345/156 |
| 6,043,806 * | 3/2000 | Atwell et al. | 345/161 |

* cited by examiner

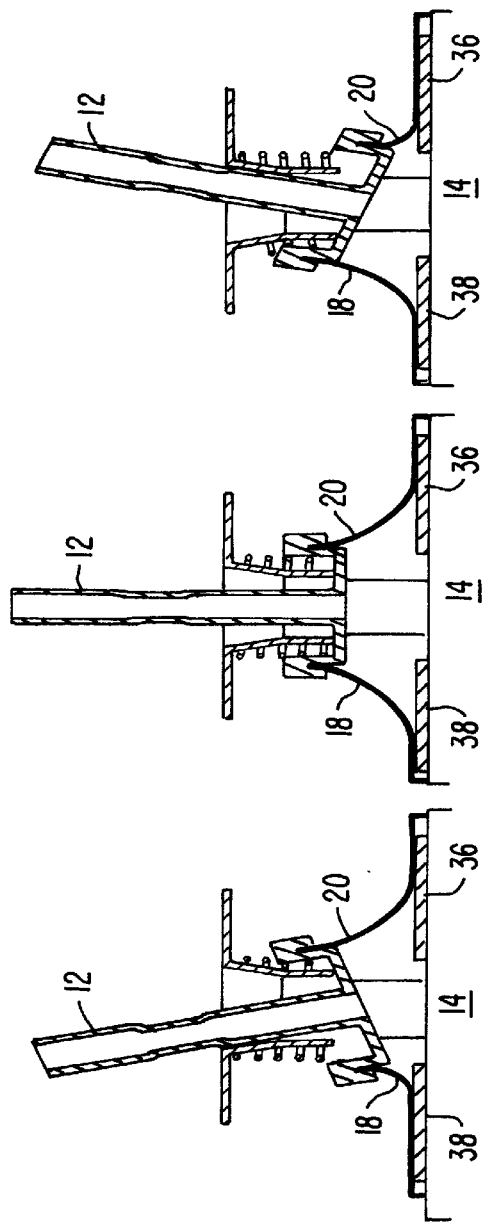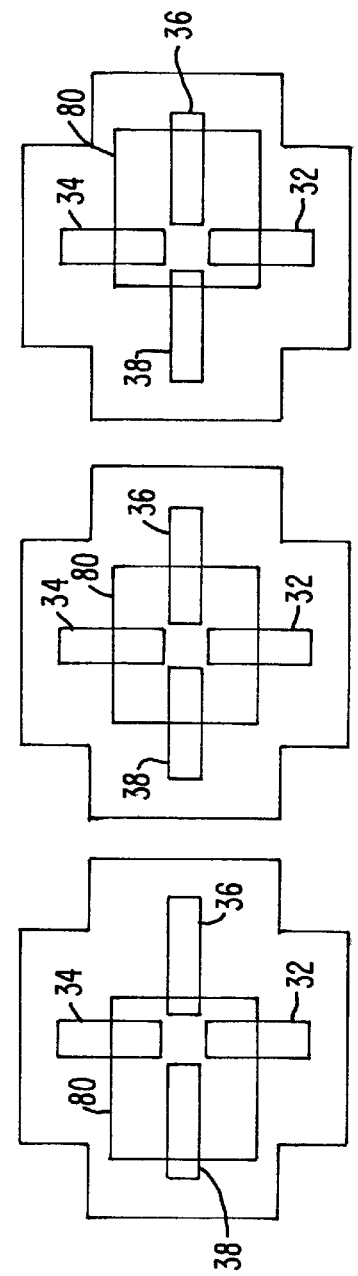

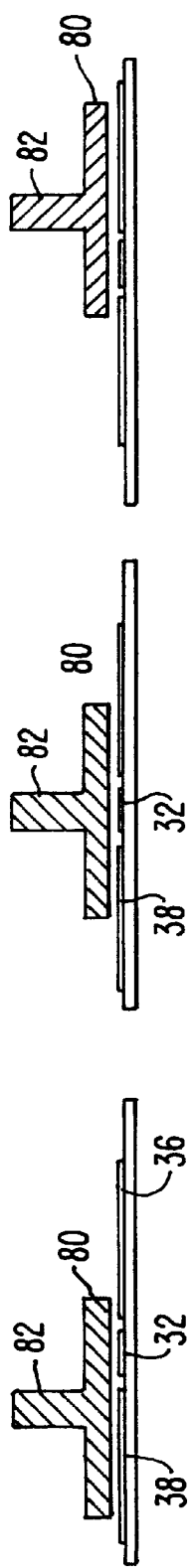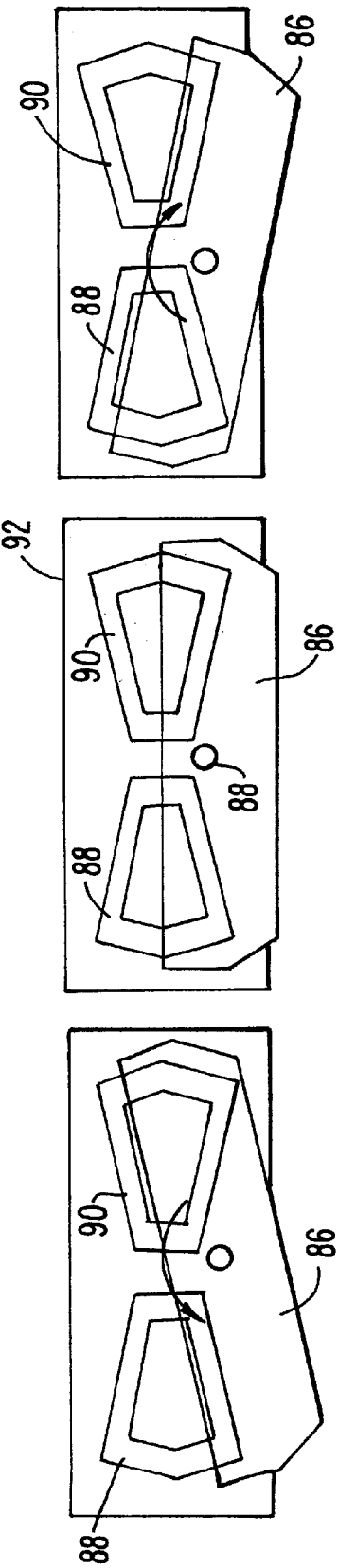

ELECTROMAGNETIC POINTING DEVICE USING VARYING OVERLAP OF COILS AND CONDUCTIVE ELEMENTS

This application is a continuation-in-part of application Ser. No. 08/956,840, filed Oct. 23, 1997, now U.S. Pat. No. 5,911,627, entitled ELECTROMAGNETIC JOYSTICK USING VARYING OVERLAP OF COILS AND CONDUCTIVE ELEMENTS.

BACKGROUND OF THE INVENTION

The present invention relates to pointing devices, and in particular to micro sticks.

Many different mechanisms have been used to detect movement of a joystick. One type of joystick uses potentiometers, with a joystick moving a wiper on the potentiometer. Other types of joystick have attempted to avoid any mechanical interaction to increase the joystick lifetime. For example, numerous types of optical joystick designs have been developed. Other joysticks use electromagnetic sensing, such as by using Hall-effect sensors. A number of joysticks are designed to use induction coils, with the amount of inductance varying and being detected by an electric circuit.

For example, U.S. Pat. Nos. 4,685,678 and 4,855,704 show induction coil joysticks. In U.S. Pat. Nos. 4,879,556 and 4,642,595, a transmitter coil is included on the stick of the joystick, and is surrounded by receiving coils. Another type of design is shown in U.S. Pat. No. 4,654,576, where a metal disk is attached to the stick, with coils mounted on different sides of it. The metal disk has a tapered bottom, and as the joystick is tilted, the disk will come closer to certain coils, changing the inductance, which can then be measured by an electric circuit.

A number of different electric circuit designs are used to measure the movement of electromagnetic joysticks. Examples of some patents which show using either differential detection, or illustrate the use of oscillators in electric circuits, are U.S. Pat. Nos. 4,305,007 and 4,685,678.

One type of pointing device which could be considered similar to a miniature joystick is a micro-stick which can be found in the middle of an IBM Thinkpad (™) laptop computer. The micro-stick is used in the same manner as imbedded trackballs or touchpads on laptops to indicate cursor movement. Such micro-sticks have also been used in gamepads and on top of a mouse. Typically, force sensing resistors are used which are made of conductive rubber making a variable contact between electrodes that are printed on an isolating support. They sense the pressure of the microdisplacement when the user pushes on the micro-stick with the user's finger. A constraint applicable to micro-sticks which is not applicable to joysticks is the limited space in which to mount the micro-stick, creating a need for a compact sensing structure.

SUMMARY OF THE INVENTION

The present invention provides a micro-stick in which the movement of the micro-stick is detected inductively. The micro-stick is connected to an actuator element which varies the interaction between an electromagnetic element and a number of conductive coils.

In one embodiment, the coils are etched tracks on a printed circuit board mounted beneath the micro-stick. The micro-stick is mounted on a plate having a number of pins extending through the circuit board. On the other side of the circuit board is a flexible metal sheet which is contacted by the pins, and moved away from the coils in a direction in which the micro-stick is tilted. This increased separation of the metal sheet from the coils can then be detected.

In order to mount the coils in a small space, they are preferably printed on both sides of the printed circuit board. By mounting the metal sheet below the printed circuit board and having holes in the PCB allowing the micro-stick to deflect the metal sheet through the holes further provides a compact structure.

For a further understanding of the nature and advantages of the invention, reference should be made to the following description taken in conjunction with the accompanying drawings.

BRIEF DESCRIPTION OF THE DRAWINGS

FIGS. 3A–3C are diagrams illustrating the movement of a joystick according to the present invention.

FIGS. 4A–4C are diagrams illustrating the movement of a joystick having a single plate with translational overlap of coils.

FIGS. 5A–5C are diagrams illustrating an alternate embodiment in which the coils are mounted vertically opposite a rotating plate.

DETAILED DESCRIPTION OF THE PREFERRED EMBODIMENTS

FIGS. 1–10 illustrate the basic joystick structure and electromagnetic circuits set forth in the parent application which can be applied to a microstick.

FIGS. 11–15 illustrate the embodiments of a micro-stick structure.

Figure 1:
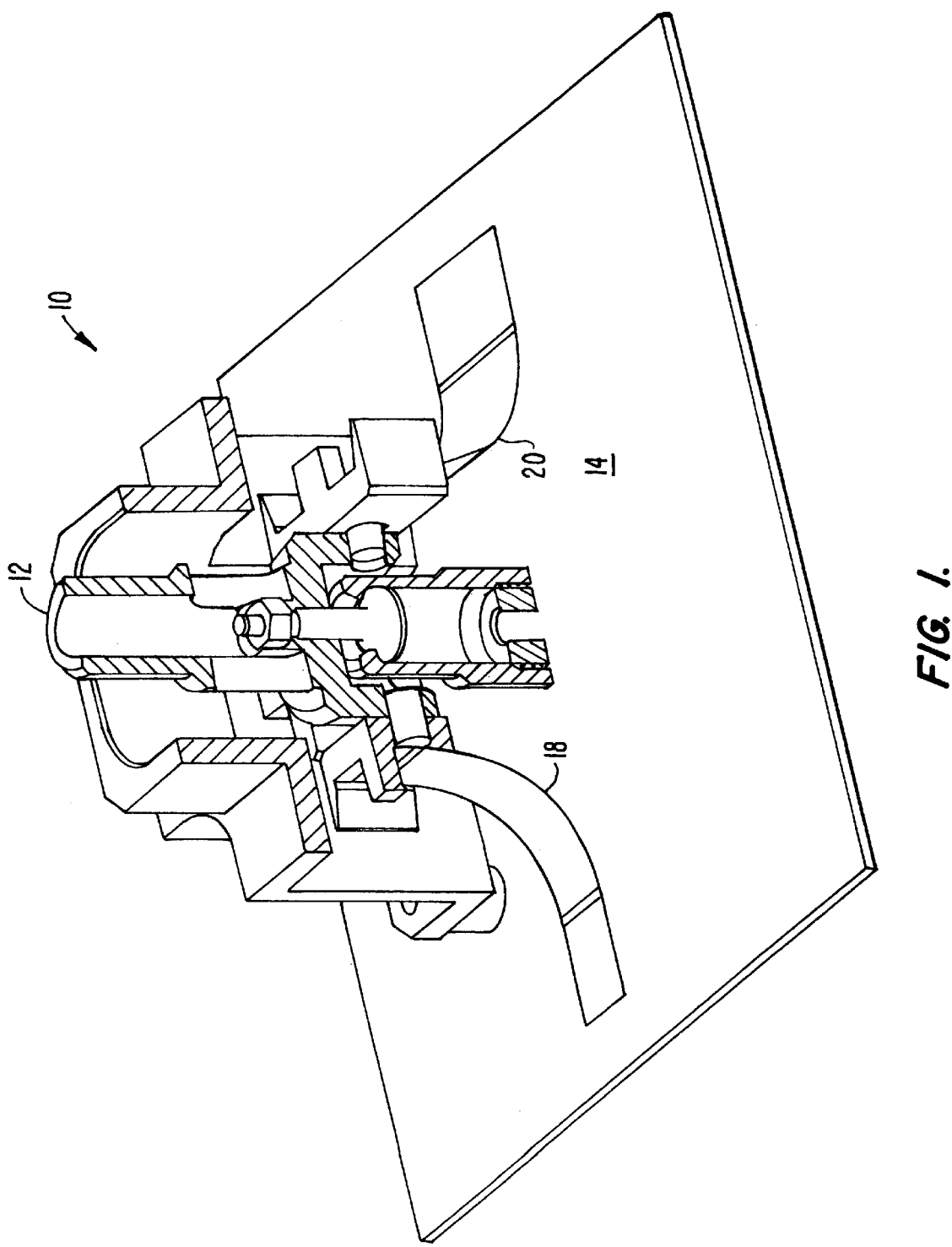
FIG. 1 is a perspective view of one embodiment of a joystick structure according to the invention.

FIG. 1 illustrates the base portion 10 of a joystick showing a stick 12 onto which a handle can be attached for a user to manipulate. The base of the stick extends through a printed circuit board (PCB) 14 to an underlying baseplate. A pair of flexible, steel blades 18 and 20 are connected to stick 12 and the PCB 14. In a preferred embodiment, additional steel blades would be connected along an orthogonal axis to give four steel blades in total.

Figure 2:
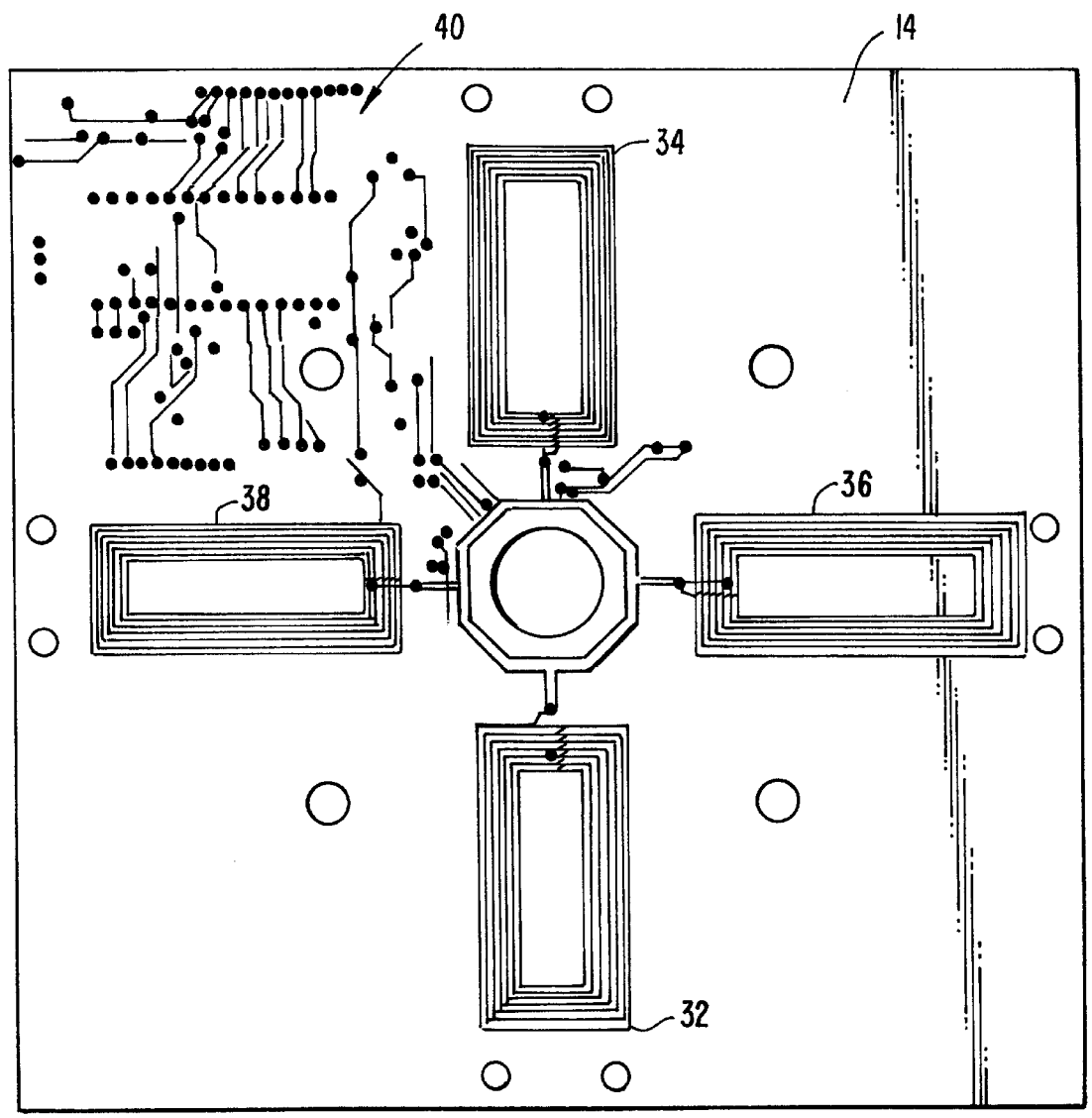
FIG. 2 is a diagram illustrating the circuit board traces with the coils on the PCB of FIG. 1.

FIG. 2 illustrates the metal traces on PCB 14. A first coil 32 is positioned beneath steel blade 14, while a second coil 34 is positioned beneath blade 20. Additional coils 36 and 38 would be positioned beneath additional steel blades (not shown in FIG. 1 for clarity).

Referring back to FIG. 1, blades 18 and 20 can have their ends free, so that as stick 12 is tilted, they slide farther away from the center of the PCB. Alternately, the ends of the blades can be screwed, riveted or otherwise attached to the PCB so that the blades don't move, but rather flex as the stick 12 is rotated. As the stick is rotated in one direction, one blade will flex down, and the other flex up, varying the amount of overlap between the blade and the underlying coil. When the blade slides across the area of the coil, the amount of overlap will increase or decrease, causing a change in the quality factor of the coil which can be measured. In the embodiment where the blades are attached to the PCB, these blades can also act as springs which provide a mechanical centering force for stick 12. Alternately, separate springs could be used for the sliding version of the blades.

Also shown in FIG. 2 are traces 40 for an electric circuit to measure the change in impedance of a resonant circuit due to changes in the quality factor of the coils as the steel blades cover more or less of each coil. A block diagram of the circuit is included in FIG. 9 below. The traces shown in FIG. 2 are covered with an insulating layer to protect them from wear by the steel blades and to avoid short circuits (or the coils could be on the other side of the PCB).

Generally, in operation, the steel blades are positioned such that when the stick 12 is at a central, rest position, each steel blade will cover between 25% and 75%, preferably about one-half, of its corresponding coil, but in any case the same area of both coils. This provides a centered position such that if the steel blade covers more or less of the coil, the quality factor is varied from the central point approximately equal amounts in both directions. By using differential detection, the accuracy can be further enhanced, while the variations that depend on factors like temperature, power supply voltage etc. are self-compensated, and the center (rest) position can be located independently of the sensitivity of the electronic circuitry. In one embodiment, the amount of the coil overlapped by the steel plate can vary from between a minimum amount of 10–25% to a maximum amount of 75–90%.

In the embodiment shown, each coil includes seven turns or loops, with each trace being 15 mils across, and having a gap between traces of 15 mils. Although rectangular coils have been shown, other coil configurations could be used. For example, the coils could be square, trapezoidal or a curved triangle or curved trapezoid. The curved triangle (trapezoid) could be used as a way to correct for the linearity of the variation of impedance Vs. the relative position of the coil and the metal or other conductive part.

In alternate embodiments, instead of steel blades, either rubber or plastic could be used, with either metal traces or embedded ferrite or metal particles to provide the necessary electromagnet element to vary the quality factor of the coils. The blades are insulated from each other, or connected together to form a single blade. In an alternate embodiment, where plastic or other materials are used for the blades, the coils could be placed on the blades themselves, with the PCB board (or simply a base substrate) containing a steel plate or other conductive material, in a fixed position. In an alternate embodiment, the coils could be made of flexible PCB, flexing above a steel plate in a fixed position, or other conductive material in a fixed position.

In addition, the steel blades could be mounted in other manners than as shown, and still flex and vary the amount of coil covered. For example, the portion near the PCB board may be higher than the portion near the joystick, the curvature could be reversed, etc. Alternately, instead of the steel blade being fixed to the PCB board by a screw, it could be loose, optionally within guides, so that it can move laterally. Thus, a combination of bending and lateral movement would vary the amount of the blade over the coil. In an alternate embodiment, the coils could be printed on a bottom side of a PCB board, with the PCB itself providing the insulating layer needed to protect the traces. In yet another embodiment, the coils could be on both sides of the PCB board, connected together through a via to form a single coil. This would allow either a larger value of inductance to be achieved on the same footprint, or the same value of inductance to be placed in a smaller footprint.

FIGS. 3A–3C illustrate the operation of the joystick of FIG. 1. As shown in FIG. 3A, stick 12 is tilted to the left, flexing plate 18 so that it covers most of coil 38. At the same time, plate 20 is stretched, uncovering a portion of coil 36. Thus, the overlap of plate 18 and coil 38 increases, while the overlap of plate 20 and coil 36 decreases. This can be detected from either coil, or through differential detection to increase the accuracy, to reduce the variations that depend on factors like temperature, power supply voltage etc., and, before all, to locate the center (rest) position independently of the sensitivity of the electronic circuitry.

FIG. 3B shows the joystick in the centered position, with each coil equally overlapped. FIG. 3C shows the stick 12 tilted to the right, resulting in more overlap between plate 20 and coil 36, and less overlap between plate 18 and coil 38. (Please note that the dimensions of the blades and coils in FIGS. 3A–3C have been exaggerated to illustrate the operation of the invention).

FIGS. 4A–4C show an alternate embodiment of the invention in which a square plate 80 is attached to a stick 82. As the stick is rotated, plate 80 moves translationally, or parallel to the coils, to vary the amount of overlap of the four coils 32, 34, 36, and 38. FIG. 4 is broken up into FIGS. 4A1–4C1, showing a diagram of the movement from a top view, while FIGS. 4A2–4C2 illustrate a diagram of the movement from a side view.

FIGS. 4B1 and 4B2 illustrate a center position, in which plate 80 equally overlaps the coils. FIGS. 4A1 and 4A2 illustrate plate 80 moving to the left, to have more overlap of coil 38, and less of coil 36. No up or down movement has occurred, and accordingly coils 32 and 34 are equally overlapped at this point, and therefore no movement is measured in the vertical direction. The opposite movement is shown in FIGS. 4C1 and 4C2, wherein the plate 80 moves to the right, causing an increased overlap of coil 36, and less overlap of coil 38.

Figure 6:
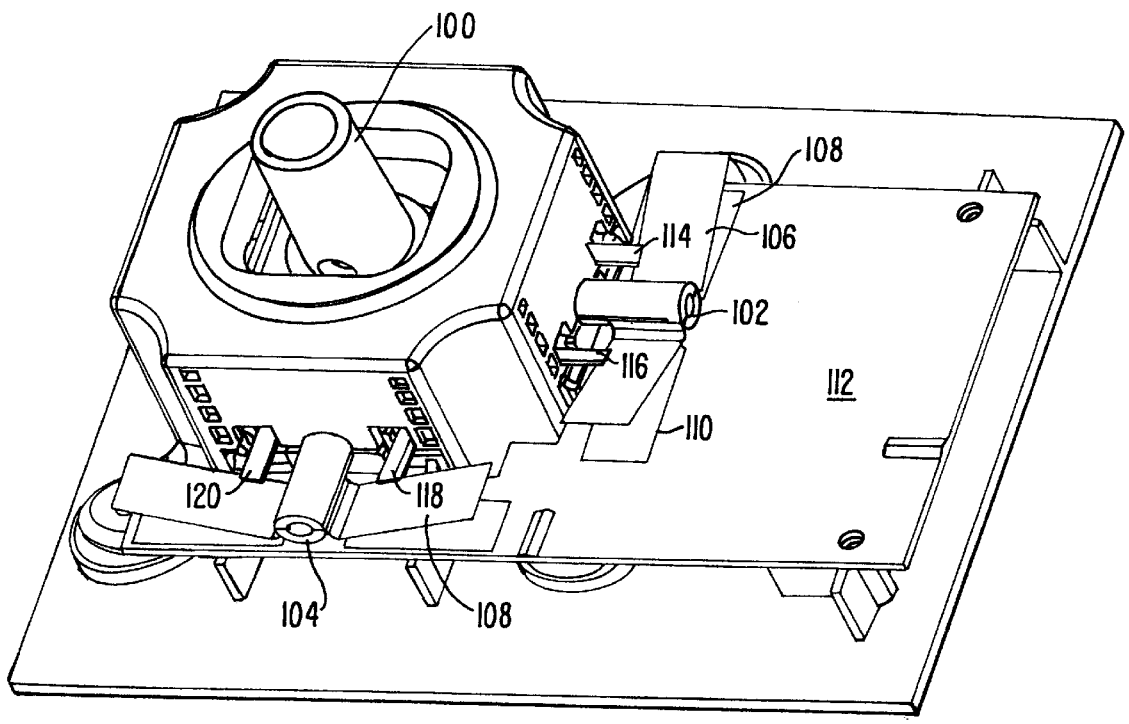
FIG. 6 is a perspective view of an alternate embodiment of the invention using rotating, V-shaped wings for the steel plates.
Figures 7A, 7B, 7C:
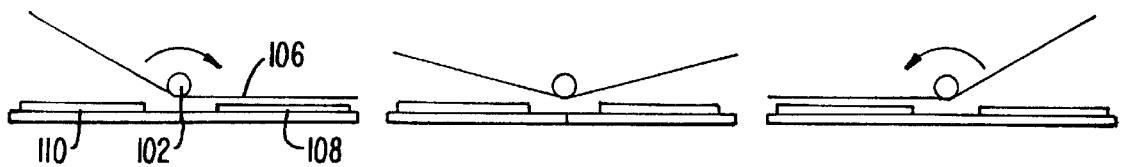
FIGS. 7A–7C are diagrams illustrating the movement of the V-shaped wings of FIG. 6.

FIG. 6 is a perspective view of another embodiment of the invention showing a joystick having a central stick 100 connected to extending arms 102 and 104 through a universal joint (Cardan joint) that separates the bi-directional movement of the stick 100 into two separated rotations of the arms 102 and 104 along their axis. Thus, as stick 100 moves, arms 102 and 104 will rotate, causing the V-shaped plates 106 and 108 to rotate up and down, as illustrated in FIGS. 7A–7C for plate 106. As the two V-wings of plate 106 move up and down, they come closer to or farther from underlying coils 108 and 110 on a PCB 112.

In one embodiment, arms 102 and 104 could be caused to rotate as stick 100 is tilted. Alternately, arms 102 and 104 could simply be supports for the V-shaped member wrapped around it, with extending members 114, 116, 118, and 120 connected to the plates for rigidity. The V-shaped members can be caused to rotate as one or other of members 114–120 are forced downward or upward. These members 114–120 could extend past stick 100, and be moved upward or downward by movement of stick 100.

Figures 8A, 8B, 8C:
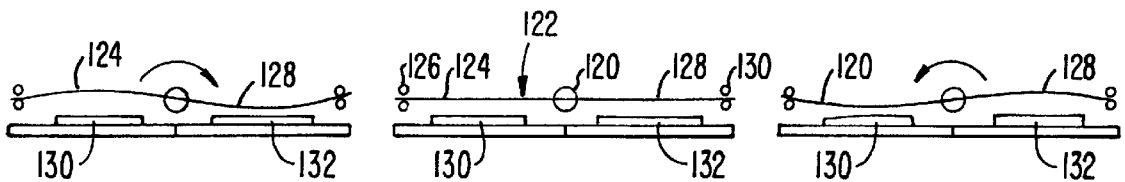
FIGS. 8A–8C are diagrams illustrating an alternate embodiment in which plates, fixed at the ends, are flexed by rotational movement.

FIGS. 8A–8C illustrate an alternate embodiment of the invention. As in FIG. 1, the flexible plates are connected both to the stick and to the support structure at the far ends of the plates. However, instead of the plate simply tilting to one side, the arm 102 or 104 (of FIG. 6) is mounted to the center portion 120 of a single flexible steel plate 122. Plate 122 has a first side 124 anchored at a point 126, and a second side 128 anchored at a point 130. As illustrated in FIG. 8A, as the stick rotates to the right, plate 122 is twisted, such that portion 124 is twisted upward, and portion 128 is twisted downward. Thus, portion 124 is farther away from a first coil 130, while portion 128 is closer to a second coil 132. As illustrated in FIG. 8C, when twisting the stick to the left, portion 124 becomes closer to coil 130, while portion 128 is farther away from coil 132. Thus, the direction and amount of movement can be detected by individual or differential sensing of the coils.

FIGS. 5A–5C illustrate an alternate embodiment of the invention. Again, as in the other figures showing movement, this is a diagram and is not intended to indicate the exact structure. FIGS. 5A–5C show a vertical plate 86, which rotates about an axis 89 (which in fact is the arm 104 of FIG. 6). Plate 86 is adjacent to vertical coils 88 and 90, mounted on a vertical PCB 92.

FIG. 5B shows the center position, in which the overlap of coils 88 and 90 by plate 86 is equal. In FIG. 5A, stick 100 is tilted to the left, causing less overlap of coil 88 and more overlap of coil 90. In FIG. 5C, stick 100 is tilted to the right, causing more overlap of coil 88 and less overlap of coil 90.

Figure 9:
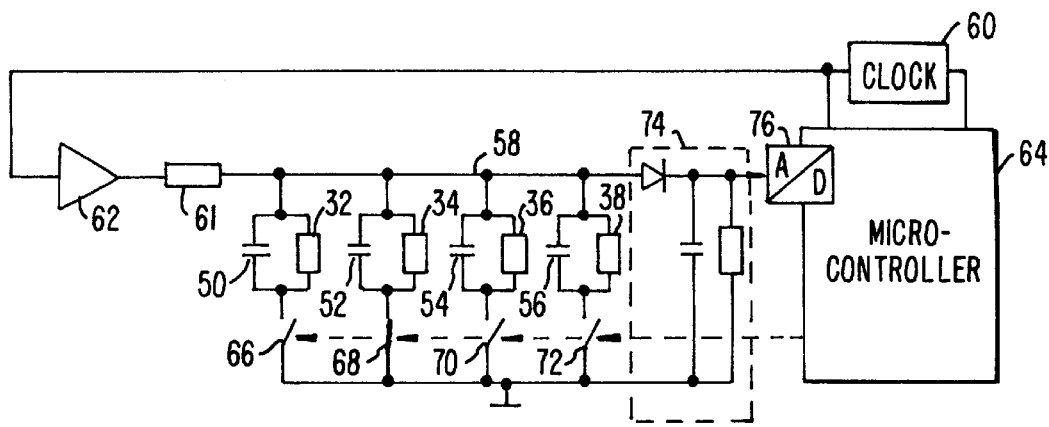
FIG. 9 is a block diagram of an electronic circuit for measuring the joystick position.

FIG. 9 is a block diagram of an electric circuit for use with the present invention. FIG. 9 shows the four inductive coils 32, 34, 36, and 38 also shown in FIG. 2. Each of the coils includes a capacitor in parallel with a deformer resonant circuit, shown as capacitors 50, 52, 54 and 56. As will be understood by those with skill in the art, the resonant circuits may include other impedances as well, but they are not shown here to avoid obscuring the invention. Each of the resonant circuits is connected together at a common node 58. This node is driven by an oscillator 60 through a driver or amplifier 62 to provide a resonant condition. (N.B. embodiments where all the coils would share one single capacitor from the common node 58 to the reference ground are possible: that configuration would save three precision capacitors, but would show degraded performances due to a more complex layout).

A controller 64 sequentially connects each of the resonant circuits to ground to activate a particular resonant circuit. This is done through switches 66, 68, 70 and 72 (FIG. 9 shows the switch 68 closed, thus the L34-C52 circuitry is the one currently driven and measured). When a particular resonant circuit is connected to ground, a voltage divider is formed between the impedance of the resonant circuit, and the source impedance (represented by block 61) of oscillator (clock) 60 and amplifier 62. When the steel blade or the conductive part that is located the closest to the given coil moves, the metal or conductive material from the blade will absorb more or less energy from the electromagnetic field, varying the quality factor (losses) and the inductance of the coil. This will vary the impedance of the resonant circuit. This impedance will be reflected in a difference in the peak-to-peak voltage at the fixed driving frequency, which is detected by a peak detector 74. The value is then provided to an analog-to-digital (A/D) converter 76, and then to controller 64. Controller 64 monitors the four resonant circuits sequentially, and compares the values from two opposing resonant circuits along the same axis to provide differential detection.

By measuring impedance, rather than the change in frequency as in some prior art designs, more sensitivity and more resolution are obtained. This is due to the impedance change being caused by two cumulative effects. First, the quality factor will decrease as the amount of metal absorbing losses increases (more metal close to the coil forms a metal core which shows worse magnetic performance than air at high frequencies). Second, at the same time, the absorption of energy by magnetic coupling toward the metal plate reduces the apparent inductance itself (by forming a secondary winding in short-circuit).

Figure 10:
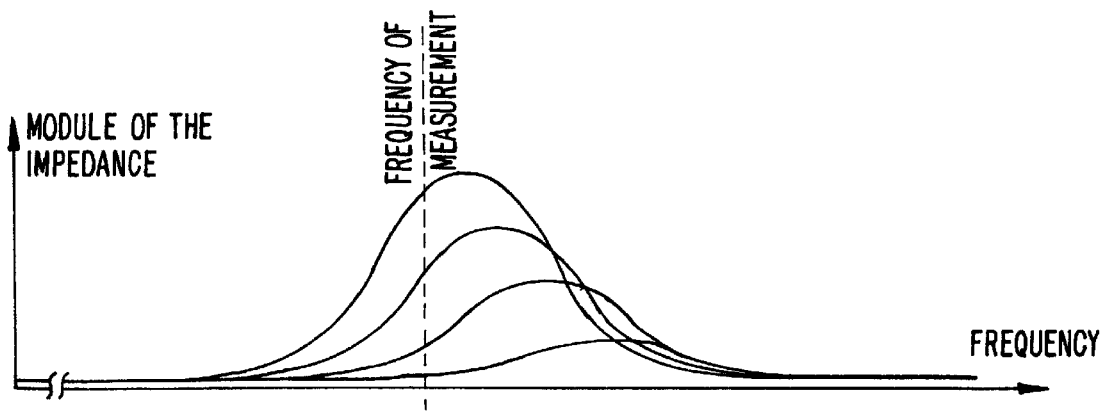
FIG. 10 is a plot of the module of impedance vs. frequency showing the variation with blade distance.

The losses in the inductor affect the quality factor (the "over-voltage factor") of the resonant L-C circuit; the more losses in the inductor, the more the curve of the module of the impedance of the resonant circuit Vs frequency is flattened and the lower becomes the peak value of that impedance module (first effect). At the same time, as an additional effect, that peak of impedance slightly moves towards higher frequencies (that is: the free natural resonant frequency is augmented as the inductance of the coil decreases due to increasing magnetic coupling toward a secondary winding in short-circuit) (second effect). Both effects affect the impedance of the circuit, in the same direction (cumulative effect), provided only that the driving/ measuring frequency is chosen lower than the minimal resonant frequency. FIG. 10 illustrates this combined movement. (N.B. if ferrite material was used in place of plain metal, almost only the inductance would be affected, but in the other direction: the closer the ferrite to the coil, the lower the frequency. The quality factor would not be affected, provided that the type of ferrite would be adapted to the frequency in use in the resonant circuit).

Basically, the electronic circuitry measures the module of the impedance of the parallel resonant L-C circuits at a given (fixed) frequency. That frequency at which the measurement is done is preferably a bit lower than the free natural resonance of the parallel L-C circuits in absence of metal, so that when the free natural resonance of the parallel L-C circuit increases in presence of metal, it can never be equal to the measurement frequency as it will always be higher. Thus the increase of the natural resonance frequency cannot disturb the main measured effect which is the decrease of the quality factor. Quite the reverse, the increase of the natural resonance frequency will even help by decreasing the module of the impedance at the frequency of measurement, thus increasing the measured/desired effect. In one embodiment, this means the free natural frequency is set higher when the metal plate is bent to its maximum distance away from the coil (not at the joystick center position).

If ferrite particles are used in an electromagnetic element connected to the stick, rather than a steel blade, an opposite effect may be achieved, wherein the frequency changes in the other direction, providing a lower frequency instead of a higher frequency. Accordingly, it would be desirable to select a natural frequency which is lower than the frequency at which the measurement is done.

In a preferred embodiment, oscillator 60 operates at approximately 4 megahertz (MHz). By using a frequency of greater than 1 MHz, the coil can be made small enough so that it can be physically built using traces on a PCB board. Using a frequency higher than approximately 8 MHz could produce excessive EMI. In one embodiment, oscillator 60 is the same oscillator used to drive controller 64 which can be a microcontroller or microprocessor. Thus, a savings in parts is achieved. In one embodiment, amplifier 62 could be a simple CMOS logic gate. In a preferred embodiment, the resonant circuits are tuned at approximately 4.3 MHz, and operate with a 4 MHz clock.

Figure 11:
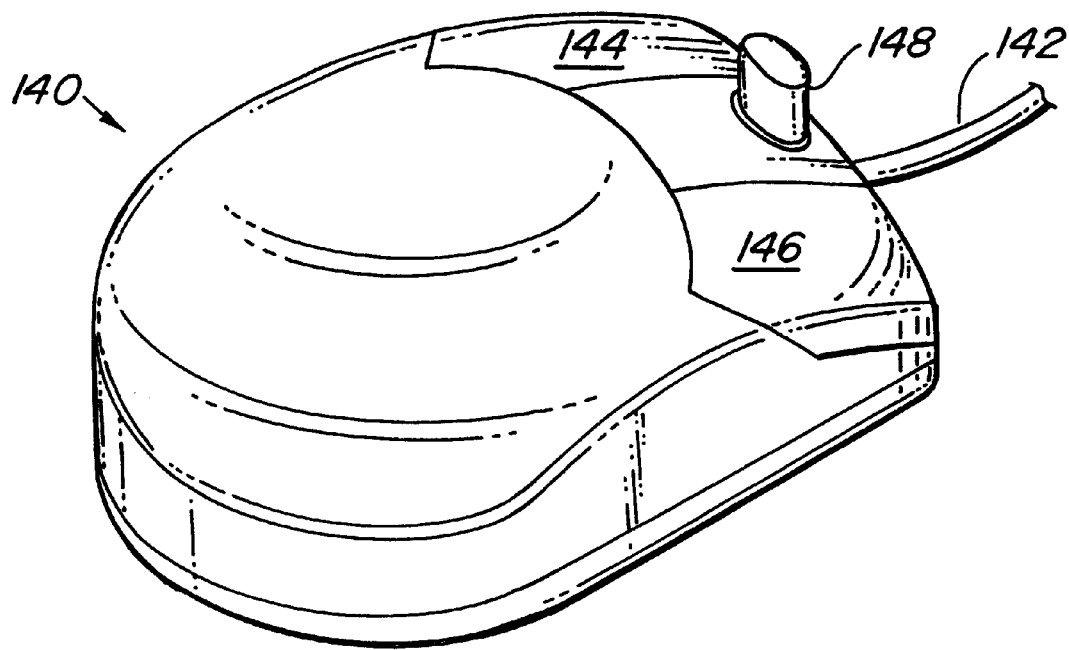
FIG. 11 is a prospective view of a mouse having a micro-stick according to the invention mounted thereon.

FIG. 11 shows a mouse 140 connected by a cord 142 to a remote computer. The mouse has two buttons 144 and 146. In between the buttons is mounted a micro-stick 148 according to the invention.

Figure 12A:
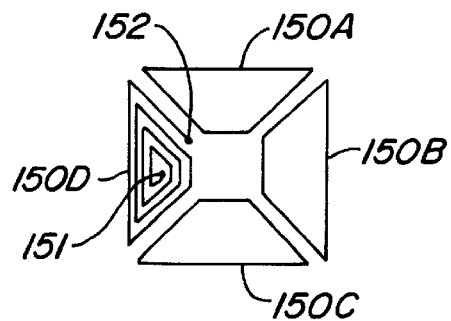
FIGS. 12A and 12B are two embodiments of coil profiles according to the invention.
Figure 12B:
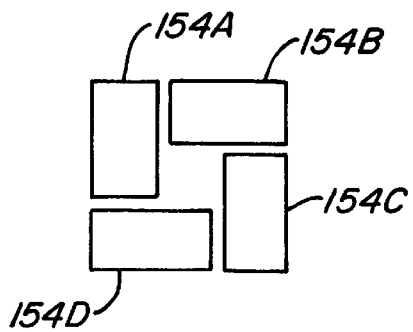

FIGS. 12A and 12B illustrate two different embodiments of coil patterns placed on a PCB in the present invention. In FIG. 12A, four coils 150A–D are shown with only coil 150D illustrating the complete coil, the others illustrating the outline. The two ends of coil 150D illustrated as 151 and 152, are vias through the PCB to an identical coil on the other side. The combination provides a coil in the same space with twice the number of loops. FIG. 12B shows rectangular rather than trapezoidal patterns for the coils with coils 154A–D. In both arrangements, a dead space is left in the middle to limit response to small, unintentional movements by user's finger.

Figure 13A:
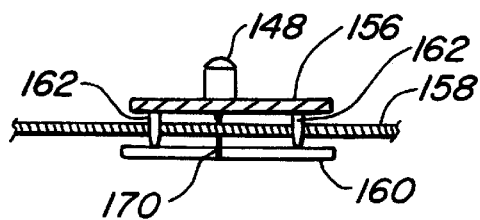
FIGS. 13A and 13B are cross-sectional diagrams of an embodiment of the invention illustrating the deflection of the metal sheet.
Figure 13B:
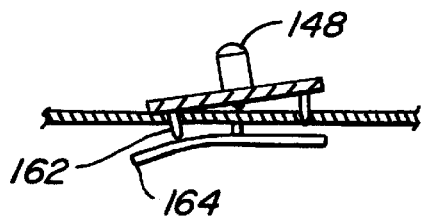

FIGS. 13A and 13B illustrate the cross-section one embodiment of the invention. Micro-stick 148 is mounted on a plate 156. Plate 156 is mounted above a PCB 158, which contains the coils of either FIG. 12A or 12B. Beneath PCB 158 is a flexible metal sheet 160. The PCB has a number of holes in it through which fingers or pins 162 extend from the bottom of plate 156 to contact with the top of flexible sheet 160.

As illustrated in FIG. 13B, when micro-stick 148 is tilted to the left a pin 162 deflects a portion 164 of flexible metal sheet 160 away from PCB 158. This deflection away from the coils on PCB 158 would change the quality factor and allow measurement due to the change in inductance in the coil or coils. The direction of the deflection is determined from which coils show a change.

Figure 14A:
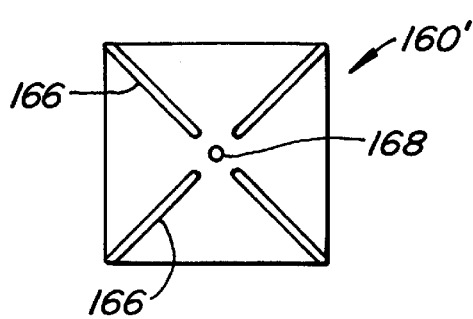
FIGS. 14A and 14B are two embodiments of the metal sheet of the invention.
Figure 14B:
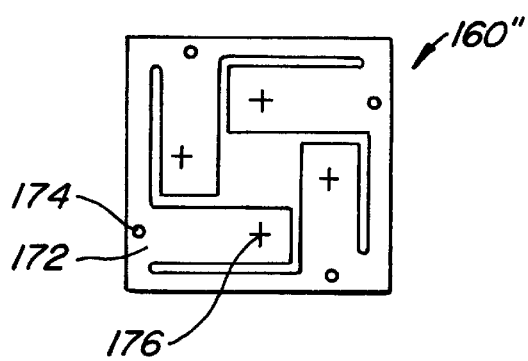

FIGS. 14A and 14B illustrate two embodiments of the construction of flexible metal sheet 160. FIG. 14A illustrates a sheet 16D', while FIG. 14B illustrates a sheet 160". Sheet 160' shows the metal sheet having diagonal cuts 166 which divide the sheet into four trapezoids which match the shape of the coils in FIG. 12A. The sheet can be mounted by a center mount post through a hole 168 to the bottom of PCB 158. Such a post is shown as post 170 in FIG. 13A.

FIG. 14B shows a metal sheet 160". This sheet has four L-shaped members 172, each supported through a hole 174. The shape of the bendable portion of the L for each of these metal sheets corresponds to the pattern of coils in FIG. 12B. The pins coming through the PCB as shown in FIGS. 13A and 13B would ideally contact at points 176 on each of the metal sheet sections. The metal sheet can actually lay on the PCB bottom, touching the coils, or at least being a fixed and equal distance from each of the coils. It simply needs to be deflectable away from the PCB surface.

Figure 15A:
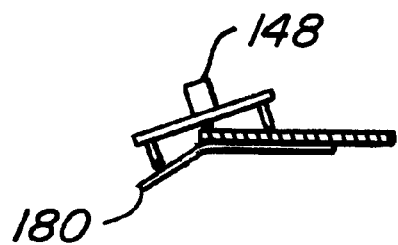
FIGS. 15A–C are diagrams illustrating different deflections according to the invention.
Figure 15B:
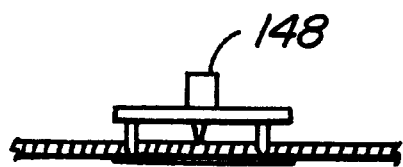
Figure 15C:
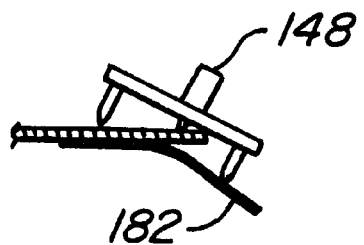

FIGS. 15A–C illustrate the operation of the embodiment of FIGS. 13A and B. In FIG. 15A, stick 148 is deflected to the left, deflecting a left-side portion 180 of the metal sheet downward. In FIG. 15B, neither side of the metal sheet is deflected with the stick 148 in the rest position. In FIG. 15C, micro-stick 148 is deflected to the right, deflecting downward a right side 182 of the metal sheet (note that the deflections are exaggerated for illustration).

In a preferred embodiment, the coils and metal sheet provide a area of 30 mm by 30 mm square. This allows the device to be easily fit within a mouse or gamepad or similar small input device. The circuitry used to detect movement is preferably the differential circuit described above, which provides a differential signal even though only one side of the pair of metal sheets providing a differential signal is moved at any given time. The responses are thus symmetrical about the center of the micro-stick.

Preferably, the output signals are transformed into a standard report format used for other micro-stick mice. For example, a format used for a mouse with a roller on it will provide an extra packet of information indicating the movement of the roller. The vertical up and down movements of the stick with respect to the mouse could be provided in such packets to mimic the movement of a roller. Additional information could be encoded into mouse packets as an extra button, etc., to indicate horizontal movement of the micro-stick. Alternatively, other encoding methods could be used. In one alternative embodiment, more than two levels of coils could be used to further increase the size of the coil in a limited area. For example, multiple layers of either PCB or a flexible polyester mylar sheet could be used with coils printed on top and bottom of each layer, then separated by an insulating layer through which a connection is provided to a second layer having coils on top and bottom. This would give a total of four stacked coils in the same area. Alternatively, higher numbers of stacked coils such as this could be generated. In addition, other patterns of the coils could be provided and shapes could be varied as well. For example, rather than a square target area, the target area could be made circular.

In yet another alternate embodiment, where only one axis (2 coils) is used, instead of attaching the micro-stick to a plate with pins, it could be attached directly to a flexible metal sheet mounted above the PCB. If mounted on a center support, tilting to the right with the lefthand side, and vice versa. By interpreting the signals in the opposite manner to show a decrease in the signal indicating movement in the opposite direction, the movement of the micro-stick can be detected.

An additional spring mechanism for centering the stick may be added, to supplement the centering effect of the flex blades, to enhance the feel of the microstick. The flexible blades alternately could be the coils on a flex PCB, with the fixed part being a metallic chassis. The metallic blades could be replaced by a metallic plate separated from the PCB coils by a flexible material such as a light foam rubber. This would function both as a centering spring to maintain the micro-stick in place, and also prevent the metallic plate from touching (scratching) the printed coils. Alternately, a stick that does not bend, but rather slides (moves translationally) a few millimeters in each direction could be used. A limiting square hole (with a centering spring) could be used to limit the translational movement. A miniaturized version of the electromagnetic configuration of FIG. 4 could be used.

Alternatively, any of the embodiments in the earlier figures showing joystick structures could be applied to a micro-stick according to the invention.

As will be understood by those of skill in the art, the present invention may be embodied in other specific forms without departing from the essential characteristics thereof. Accordingly, the foregoing description is intended to be illustrative, but not limiting, of the scope of the invention which is set forth in the following claims.

What is claimed is:

1. An input device comprising:
   a micro stick having a size that is coverable by a single finger of a user, and is actuatable by said finger;
   an electromagnetic element capable of varying a quality factor of conductive coils;
   at least first and second conductive coils;
   an actuator element, connected to said micro stick, configured to vary an interaction between said electromagnetic element and said coils in response to movement of said micro stick by said finger, thereby varying a quality factor of said coils;
   at least one capacitor coupled in parallel with at least one of said coils to form a resonant circuit; and
   an impedance measuring circuit connected to said coils for measuring a change in impedance of said resonant circuit due to varied interaction of said coils and said electromagnetic element.

2. The input device of claim 1 wherein:
   said coils are mounted on a printed circuit board underneath said micro stick;
   said electromagnetic element is mounted below said printed circuit board; and
   said actuator element extends past said printed circuit board to move a portion of said electromagnetic element away from said coils in response to movement of said micro switch.

3. The input device of claim 2 wherein said actuator element comprises a plurality of pins extending through holes in said printed circuit board.

4. The input device of claim 3 further comprising a plate, said micro stick being mounted on a top of said plate and said pins extending from a bottom of said plate.

5. The input device of claim 1 wherein said electromagnetic element comprises a metal sheet.

6. The input device of claim 1 wherein said actuator element is spring loaded to provide a resistance to movement of said micro stick by said finger.

7. The input device of claim 6 wherein said electromagnetic element is a flexible and spring loaded to provide said resistance upon deflection of said electromagnetic element by said actuator element.

8. The input device of claim 7 wherein said electromagnetic element is a metal sheet having at least four separately deformable sections.

9. The input device of claim 1 wherein each of said coils extends onto first and second sides of a printed circuit board.

10. The input device of claim 1 wherein said micro-stick is mounted on a mouse.

11. The input device of claim 1 wherein said micro-stick is mounted on a gamepad.

12. An input device comprising:
   a micro stick having a size that is coverable by a single finger of a user, and is actuatable by said finger;
   at least first and second conductive coil traces on a printed circuit board beneath said micro stick, each of said coil traces extending onto two sides of said printed circuit board;
   a flexible metal sheet mounted below said printed circuit board;
   a plurality of pins, connected to said micro stick and extending past said printed circuit board to move a portion of said flexible metal sheet away from said coil traces in response to movement of said micro switch, thereby varying a quality factor of said coil traces;
   at least one capacitor coupled in parallel with at least one of said coils to form a resonant circuit; and
   an impedance measuring circuit connected to said coils for measuring a change in impedance of said resonant circuit due to varied interaction of said coils and said electromagnetic element.

* * * * *